(12) United States Patent
Heubi

(10) Patent No.: US 11,705,901 B2
(45) Date of Patent: Jul. 18, 2023

(54) WIDE VOLTAGE RANGE INPUT AND OUTPUT CIRCUITS

(71) Applicant: SEMICONDUCTOR COMPONENTS INDUSTRIES, LLC, Phoenix, AZ (US)

(72) Inventor: Alexander Heubi, La Chaux-de-Fonds (CH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 0 days.

(21) Appl. No.: 17/805,916

(22) Filed: Jun. 8, 2022

(65) Prior Publication Data

US 2023/0058757 A1    Feb. 23, 2023

Related U.S. Application Data

(60) Provisional application No. 63/260,461, filed on Aug. 20, 2021.

(51) Int. Cl.
*H03K 19/0185* (2006.01)
*H03K 17/16* (2006.01)

(52) U.S. Cl.
CPC ... *H03K 17/161* (2013.01); *H03K 19/018521* (2013.01)

(58) Field of Classification Search
None
See application file for complete search history.

(56) References Cited

U.S. PATENT DOCUMENTS

| 6,859,074 B2 * | 2/2005 | Ajit | H03K 19/00315 |
| | | | 327/333 |
| 7,570,088 B1 * | 8/2009 | Ku | H03K 19/00315 |
| | | | 327/112 |
| 7,659,748 B2 | 9/2010 | Chandra | |
| 7,868,659 B2 * | 1/2011 | Ker | H03K 3/0375 |
| | | | 327/108 |
| 2004/0119526 A1 | 6/2004 | Ajit | |

FOREIGN PATENT DOCUMENTS

JP        2009536473 A    10/2009

* cited by examiner

*Primary Examiner* — Jeffery S Zweizig
(74) *Attorney, Agent, or Firm* — Polansky & Associates, P.L.L.C.; Paul J. Polansky; Nathan H. Calvert

(57) ABSTRACT

A driver circuit drives an output terminal with an input/output voltage using an NMOS transistor and a PMOS transistor. A pre-driver for the NMOS transistor supplied with a drive voltage and receives a data signal referenced to the drive voltage. A pre-driver for the PMOS transistor has a positive supply input connected to the positive supply rail, a negative supply input receiving a second drive voltage equal to the supply voltage minus the drive voltage. A level shifter circuit, shifts the data signal to be referenced between the supply voltage and the second drive voltage. A charge pump circuit for providing second drive voltage, the charge pump circuit driven with a variable switching frequency proportional to a current of the PMOS transistor.

20 Claims, 4 Drawing Sheets

WIDE VOLTAGE RANGE INPUT AND OUTPUT CIRCUITS

This application claims the benefit of U.S. Provisional Patent Application No. 63/260,461, filed on Aug. 20, 2021, the entire contents of which are incorporated herein by reference.

FIELD OF THE INVENTION

The disclosure relates to input/output circuitry for integrated circuits, and particularly to mixed-voltage input/output circuitry.

BACKGROUND

Conventional digital input/output circuits (IOs) use an IO voltage (VDDO) to drive the output transistors. Such an approach is limited in that the voltage range on which these IOs can operate is limited on the low side by the threshold voltage of the output transistors, and limited on the high side by the maximum gate to source/drain voltage given by the process node. Another problem is that these IOs are fairly slow at low VDDO, while being too fast at high VDDO and thus creating high current spikes when switching (a problem referred to as Simultaneous Switching Output noise). Furthermore, conventional circuits have high power consumption when operating with a high VDDO.

Some known approaches to solving these problems use stacks of transistors for the IO circuit to keep the transistors in a safe operating area. However, such approaches require multiple reference voltages to be generated for biasing the IO transistors and their driving circuits. Furthermore, the bias voltage supplies consume relatively large static currents.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

Figure 1:
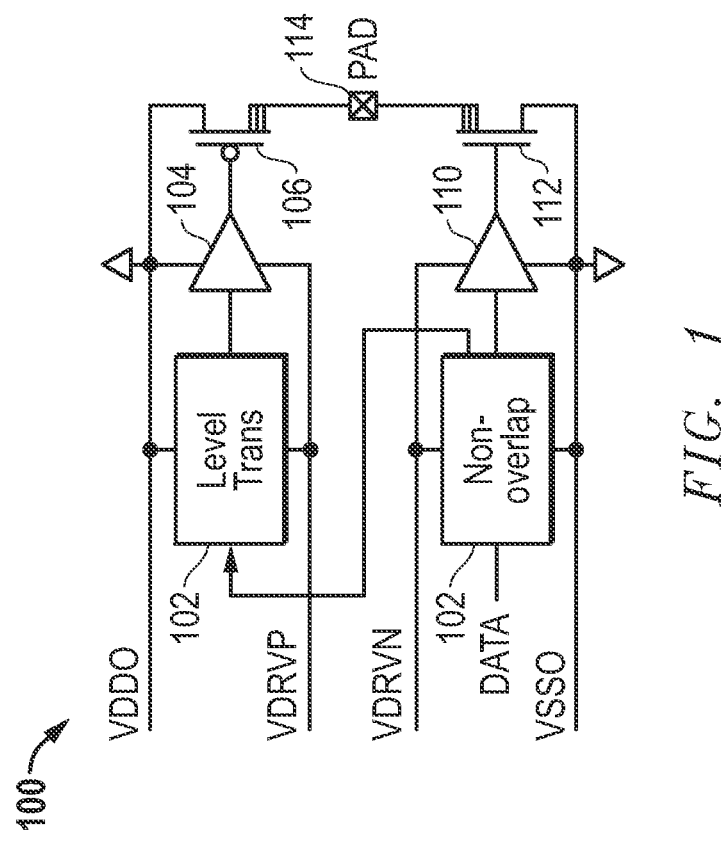
FIG. 1 illustrates in mixed block diagram and circuit diagram form a driver circuit according to some embodiments.

FIG. 1 illustrates in mixed block diagram and circuit diagram form a driver circuit 100 according to some embodiments. Driver circuit 100 is embodied on an integrated circuit and generally operates over a wide range of input/output (IO) voltages with a low quiescent current, a low operating current and low simultaneous switching output (SSO) noise. Driver circuit 100 includes a level translator 102, a pre-driver 104, a p-type metal-oxide semiconductor (PMOS) transistor 106, a non-overlap buffer circuit 108, a pre-driver 110, and an n-type metal-oxide semiconductor (NMOS) transistor 112. Driver circuit 100 drives a signal on an output pad or output terminal 114 labelled "PAD". Driver circuit 100 is supplied with a drive voltage supply provided between supply rails labelled "VDDO" and "VSSO", and two intermediate drive voltage rails labelled "VDRVP" and "VDRVN". The voltage labels will be used to refer to both the voltage rails and the voltages thereon.

Level translator 102 has a positive supply input connected to the VDDO voltage rail, a negative supply input connected to the VDRVP voltage rail, an input connected to non-overlap buffer circuit 108, and an output. Pre-driver 104 has a positive supply input connected to the VDDO supply rail, a negative supply input connected to the VDRVP voltage rail, an input connected to the output of level translator 102, and an output connected to a gate of PMOS transistor 106. The output of level translator circuit provides a version of the input signal level shifted to its supply level for driving PMOS transistor 106, as further discussed below.

Non-overlap buffer circuit 108 has a positive supply input connected to the VDRVN rail, a negative supply input connected to the VSSO rail, an input receiving a data signal labelled "DATA" to be driven, a first output connected to an input of pre-driver 110, and a second output connected to the input of level translator 102. Pre-driver 110 has a positive supply input connected to the VDRVN voltage rail, a negative supply input connected to the VSSO voltage rail, an input connected to the second output of non-overlap buffer circuit 108, and an output connected to NMOS transistor 112. Generally, non-overlap buffer circuit 108 creates signals on its first and second outputs based on the DATA signal for activating pre-drivers 104 and 110 such that NMOS transistor 112 and PMOS transistor 106 are not activated at the same time. The DATA signal, in this implementation, toggles between the VDRVN and VSSO voltage levels.

PMOS transistor 106 has a source connected to the VDDO supply rail to receive a supply voltage, a drain connected to output terminal 114 and a gate receiving the output of pre-driver 104. NMOS transistor 112 has a source connected to the VSSO supply rail, a drain connected to output terminal 114, and a gate receiving the output of pre-driver 110. In a preferred implementation, PMOS transistor 106 and NMOS transistor 112 are laterally-diffused metal-oxide semiconductor (LDMOS) transistors, but other power metal-oxide-semiconductor (MOS) transistors may be employed.

Figure 3:
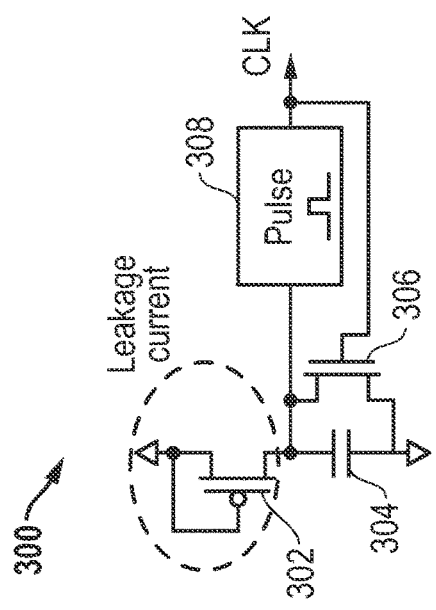
FIG. 3 illustrates in mixed block diagram and circuit diagram form a current detection circuit according to some embodiments.
Figure 4:
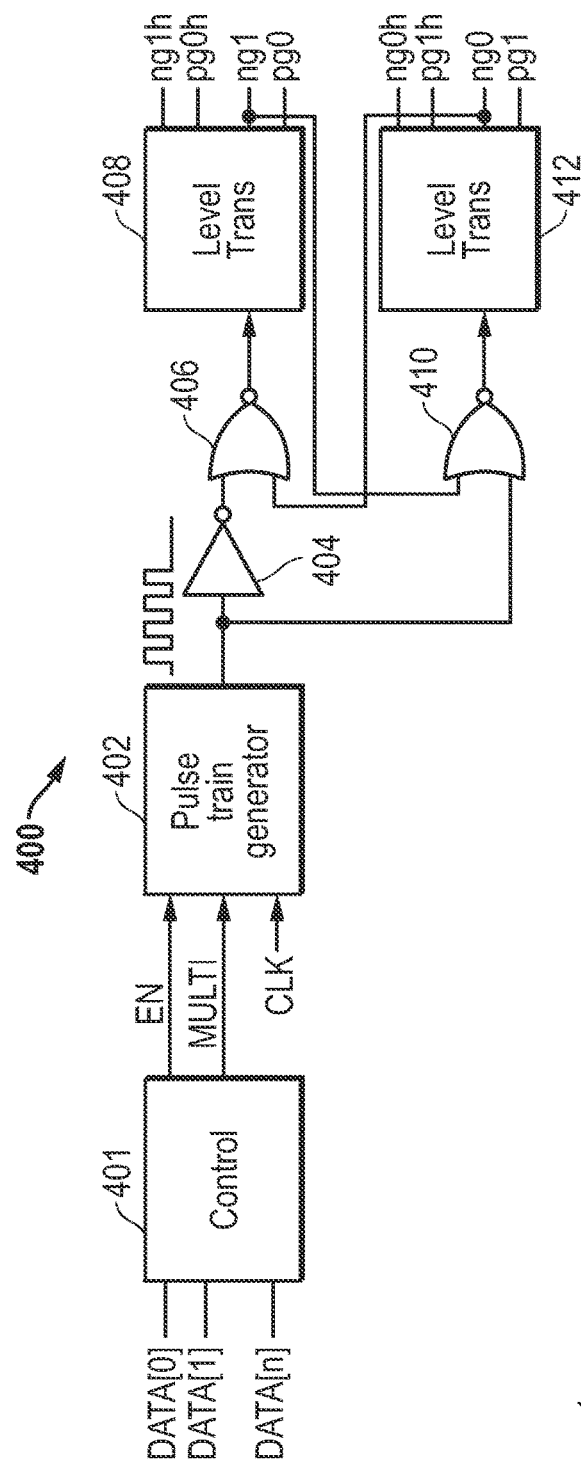
FIG. 4 illustrates in mixed block diagram and circuit diagram form a charge pump circuit according to some embodiments.
Figure 5:
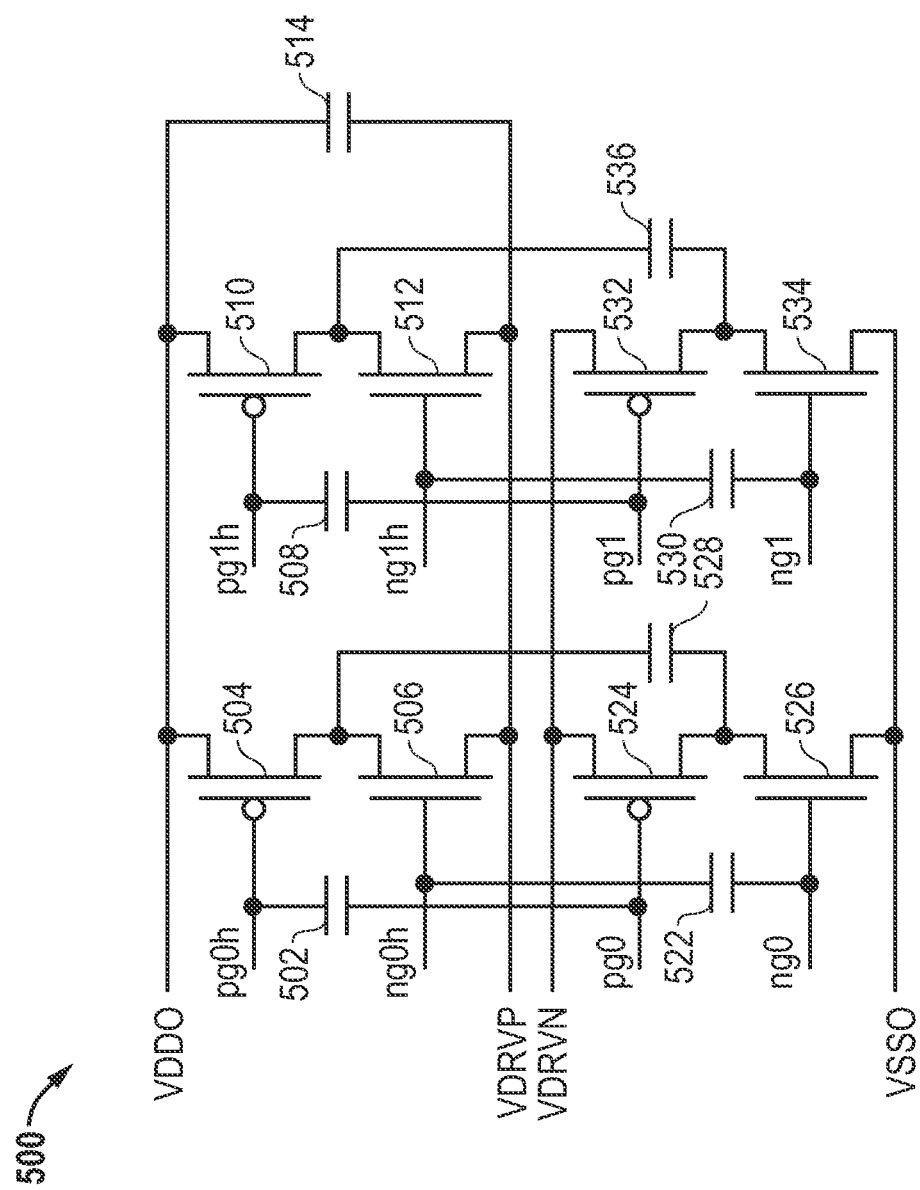
FIG. 5 illustrates in circuit diagram form a 2-phase charge pump according to some embodiments.

In operation, the DATA signal is provided referenced to the VDRVN voltage, which is also employed to drive NMOS transistor 112 to pull output terminal 114 down. PMOS transistor 106 is driven with a level-shifted signal, referenced between VDDO and VDRVP. In this implementation, VDRVP is a second drive voltage equal to the signaling supply voltage VDDO minus the drive voltage VDRVN. A charge pump circuit, further described with respect to FIGS. 3-5, provides the drive voltage VDRVP, and is driven with a variable switching frequency proportional to a current of PMOS transistor 106.

The voltages VDDO and VSSO provide the IO supply to pull the output (PAD) up or down, respectively. VDRVN, typically around 1.6V, supplies the low side non-overlap buffer 108 and pre-driver 110. The gate of the NMOS transistor 112 is driven to VDRVN for a low state. VDRVP, typically around VDDO-1.6V, supplies level translator 102 and pre-driver 104. The gate of the PMOS transistor 106 is driven to VDRVNP for a high state on output terminal 114.

The depicted driver architecture decouples the driving voltage of output transistors 106 and 112 from VDDO, allowing an increased operating range as compared to traditional driver architectures, while consuming low power with low switching noise. For example, driver circuit 100 can operate from under 0.9V to greater than 5V. For a low VDDO, 0.9V for example, VDRVP will be a negative voltage (as referred to VSSO). In some embodiments, transistors 106 and 112 are split into several devices, which can be selectively activated to control the IO drive strength, providing control of maximum current and speed of driver circuit 100.

Figure 2:
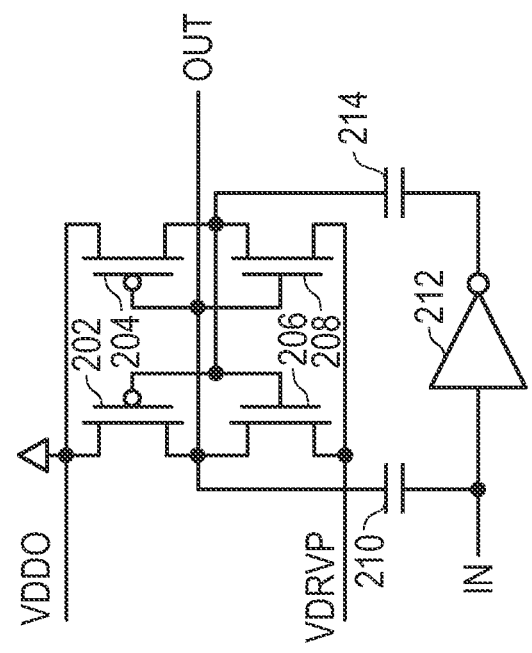
FIG. 2 illustrates in circuit diagram form a level translator circuit according to some embodiments.

FIG. 2 illustrates in circuit diagram form a level translator circuit 200 according to some embodiments. Level translator circuit 200 is suitable for use as level translator 102 of FIG. 1, and in a similar function in other embodiments. Level translator circuit 200 includes an input receiving a signal to be level-shifted, labelled "IN", an input receiving the drive voltage VDRVP, and an input receiving the VDDO voltage, and an output labelled "OUT". Level translator circuit 200 includes two PMOS transistor 202 and 204, two NMOS transistor 206 and 208, two capacitors 210 and 214, and an inverter 212. PMOS transistors 202 and 204 each have a source terminal connected to the VDDO supply rail. PMOS transistor 202 has a drain connected to first terminal of capacitor 210 and a gate connected to a first terminal of capacitor 214. PMOS transistor 204 has a gate connected to the first terminal of capacitor 210 and a drain connected to the first terminal of capacitor 214.

NMOS transistors 206 and 208 each have a source connected to the VDRVP voltage rail. NMOS transistor 206 has a gate connected to the first terminal of capacitor 214, and a drain connected to the first terminal of capacitor 210. NMOS transistor 208 has a gate connected to the first terminal of capacitor 210 and a drain connected to the first terminal of capacitor 214.

Inverter 212 has an input receiving the signal IN, which is also connected to the second terminal of capacitor 210. The output of inverter 212 is connected to the second terminal of capacitor 214. The level shifter output OUT is connected to the first terminal of capacitor 210.

FIG. 3 illustrates in mixed block diagram and circuit diagram form a current detection circuit 300 according to some embodiments. Generally, current detection circuit 300 operates to detect the leakage current through PMOS transistors at the driver output (e.g., PMOS transistor 106), and provide pulses at a rate proportional to the leakage current. Current detection circuit 300 has a positive input, a negative input, and an output, and includes a PMOS transistor 302, a capacitor 304, an NMOS transistor 306, and a pulse generator 308.

PMOS transistor 302 has a source connected to the positive input, a gate connected to the source in a diode-connected configuration, and a drain connected to a positive terminal of capacitor 304. The negative terminal of capacitor 304 is connected to the negative input of current detection circuit 300. NMOS transistor 306 has a drain connected to the positive terminal of capacitor 304, a source connected to the negative input, and a gate connected to the output of pulse generator 308. Pulse generator 308 has an input connected to the positive terminal of capacitor 304, and an output providing a pulse labelled "CLK" responsive to the input voltage exceeding a designated level.

In operation, PMOS transistor 302 is held in a deactivated state, and the leakage current charges capacitor 304 toward the voltage on the positive input. When the voltage on capacitor 304 passes a designated threshold for pulse generator 308, a pulse is supplied at the output. The pulse is also fed back to NMOS transistor 306 to activate it, discharging capacitor 304. This feedback arrangement produces a pulse chain proportional to the leakage current. This pulse train is used in driving a charge pump for efficiently supplying the voltage VDRVP, as further described below with respect to FIG. 4.

FIG. 4 illustrates in mixed block diagram and circuit diagram form a charge pump circuit 400 according to some embodiments. Charge pump circuit 400, in this implementation, is used to supply drive voltage VDRVP for several driver circuits 100 (FIG. 1), and includes a first input labelled "CLK", and a number of inputs labelled "DATA[0]" through "DATA[n]" for receiving data signals for each driver in order to supply an appropriate amount of charge for maintaining VDRVP while minimizing wasted energy. Charge pump circuit 400 includes a control circuit 401, a pulse train generator 402, an inverter 404, two NOR gates 406 and 410, and two level translators 408 and 412 which act as charge pumps in the depicted charge pump circuit 400.

Control circuit 401 receives the inputs DATA[0] through DATA[n], and produces two output signals labelled "EN" and "MULTI", which are fed to pulse train generator 402. The number of DATA inputs depends on how many driver circuits 100 are supplied by charge pump circuit 400. For example, sixteen driver circuits may be supplied in some embodiments, providing an "n" of 15. Control circuit 401 produces a HIGH signal on its output EN when any of the DATA signals transitions from LOW to HIGH, and produces a HIGH signal on its output MULTI when more than one of the data signals transitions from LOW to HIGH. Control circuit 401 may be implemented with a variety of digital circuits. In a preferred embodiment, each input is fed to a flip-flop to detect the rising edge of the DATA signal, with the output of the flip-flops fed to combinatorial logic to produce the EN and MULTI output signals. The flip-flops may be reset asynchronously with an acknowledgement from pulse train generator 402.

Pulse train generator 402 has an enable input receiving the EN signal, a second input receiving the MULTI signal, a third input receiving the signal CLK, and an output providing a pulse signal. In this embodiment, the CLK signal is connected to the output of a current monitoring circuit such as current detection circuit 300 of FIG. 3.

Inverter 404 has an input receiving the pulse signal from pulse train generator 402, and an output connected to a first input of NOR gate 406. NOR gate 406 has a second input connected to an output "ng0" of level translator 412. NOR gate 410 has a first input receiving the pulse chain signal from pulse train generator 402 and a second input connected to an output "ng1" of level translator 408. The outputs of NOR gates 406 and 410 are used to drive level translators 408 and 412 to act as charge pumps to produce the VDRVP voltage, as further described below with respect to FIG. 5. In operation, pulse train generator 402 acts to produce pulses which drive level translators 408 and 412. Charge pump circuit 400 is driven with a variable switching frequency proportional to a current of the PMOS transistor in various ways.

First, the CLK input of pulse train generator 402 is employed to compensate for leakage current in the driver circuit, while the EN and MULTI inputs are used to compensate for transition activity on the driver circuit 100 (FIG. 1) compensating for the energy used by low-to-high and high-to-low transitions on output terminal 114. The output of current detection circuit 300 (FIG. 3) goes to the CLK input of pulse train generator 402, activating single pulses of the pulse train generator in order to maintain the VDRVP voltage in absence of any activity of the multiple drivers supplied by charge pump circuit 400. Without this compensation, the leakage currents of the logic which sits between VDRVP and VDDO would alter the VDRVP voltage rail, for example, in this embodiment causing VDRVP to rise to VDDO.

Second, when the output of driver circuit 100 transitions from LOW to HIGH, the driver circuit 100 has to pull the gate voltage of transistor 106 down to VDRVP. This transition requires some energy which is provided by charge pump circuit 400. To do this, the charge pump is clocked for some cycles by pulse train generator 402. Typically, one pulse is enough if only a single driver is transitioning (MULTI=LOW) or 8 clock cycles are provided if multiple drivers supplied by charge pump circuit 400 transition from low to high (MULTI=HIGH). Generally, charge pump circuit 400, which is relatively large, is shared between multiple drivers, for example one charge pump circuit for each sixteen driver circuits. The same techniques are used with fewer or more driver circuits in various embodiments.

The use of charge pump circuit 400 in combination with driver circuit 100 provides a number of advantages over known high voltage drivers. A wide IO supply voltage range is enabled, allowing the IO voltage to be below the IO device's Vgs (gate-source) threshold voltage, and above the maximum Vgs. Across such a range, the driver has constant drive and speed capabilities. The combination also uses the lowest power of known circuits with such wide-ranging capabilities, while not requiring oversized transistors for low voltage operation. Also, the driver does not have high Vgs swing on the driver output transistors at high voltage operation. Furthermore, the combination is area efficient and has very low quiescent current, with the high drive supply (VDRVP) automatically maintained based on leakage and IO activity.

FIG. 5 illustrates in circuit diagram form a two-phase charge pump ("charge pump") 500 according to some embodiments. Charge pump 500 is embodied on an integrated circuit and is generally suitable for use in implementing level translators 408 and 412 of FIG. 4, and suitable for use as a charge pump in other similar embodiments. Charge pump 500 has a positive supply input connected to the VDDO voltage rail, a negative supply input connected to the VSSO voltage rail, an intermediate voltage supply input connected to the VDRVN voltage, and an output for supplying the VDRVP voltage. Charge pump 500 includes seven capacitors 502, 508, 514, 522, 528, and 536, four PMOS transistors 504, 510, 524, and 532, and four NMOS transistors 506, 512, 526 and 534.

Generally, charge pump 500 generates the voltage VDRVP at a level of VDDO-VDRVN using the depicted two-phase circuit, preferably implemented with on-chip capacitors. The voltage VDRVP is provided at VDDO-VDRVN to maintain proper operation of driver circuit 100 (or similar drivers) across a wide range of IO voltages. While a variety of charge pump circuits are suitable, in this implementation the circuit employs two level translator circuits similar to those of FIG. 200, driven with opposing signals from NOR gates 406 and 410 at nodes "pg0", "pg1", "pg0*h*" and "pg1*h*".

PMOS transistor 504 has a source connected to VDDO, a gate connected to a first terminal of capacitor 502 at a node labelled "pg0*h*", and a drain connected to a first terminal of capacitor 528. NMOS transistor 506 has a source connected a first terminal of capacitor 514 at the VDRVP output, a gate connected to a first terminal of capacitor 522 at a node labelled "ng0*h*", and a drain connected to a first terminal of capacitor 528. PMOS transistor 510 has a source connected to VDDO, a gate connected to a first terminal of capacitor 508 at node pg1*h*, and a drain connected to a first terminal of capacitor 536. NMOS transistor 512 has a source connected a first terminal of capacitor 536, a gate connected to a first terminal of capacitor 530 at a node labelled "ng1*h*", and a drain connected to a first terminal of capacitor 514. Capacitor 514 has a second terminal connected to VDDO.

PMOS transistor 524 has a source connected to VDRVN, a gate connected to a second terminal of capacitor 502 at node pg0, and a drain connected to a second terminal of capacitor 528. NMOS transistor 526 has a source connected VSSO, a gate connected to a second terminal of capacitor 522 at a node labelled "ng0", and a drain connected to the second terminal of capacitor 528. PMOS transistor 532 has a source connected to VDRVN, a gate connected to a second terminal of capacitor 508 at node pg1, and a drain connected to a second terminal of capacitor 536. NMOS transistor 534 has a source connected to VSSO, a gate connected to a second terminal of capacitor 530 at a node labelled "ng1", and a drain connected to a second terminal of capacitor 536. Capacitor 536 has a second terminal connected to VDDO.

In operation, charge pump 500 is driven as described above with respect to FIG. 4, by applying pulses to the nodes pg0, pg1, pg0*h* and pg1*h*, for example from the output of NOR gates 406 and 410. Other suitable pulsing circuits may also be employed to drive charge pump 500 to achieve a similar result.

Figure 6:
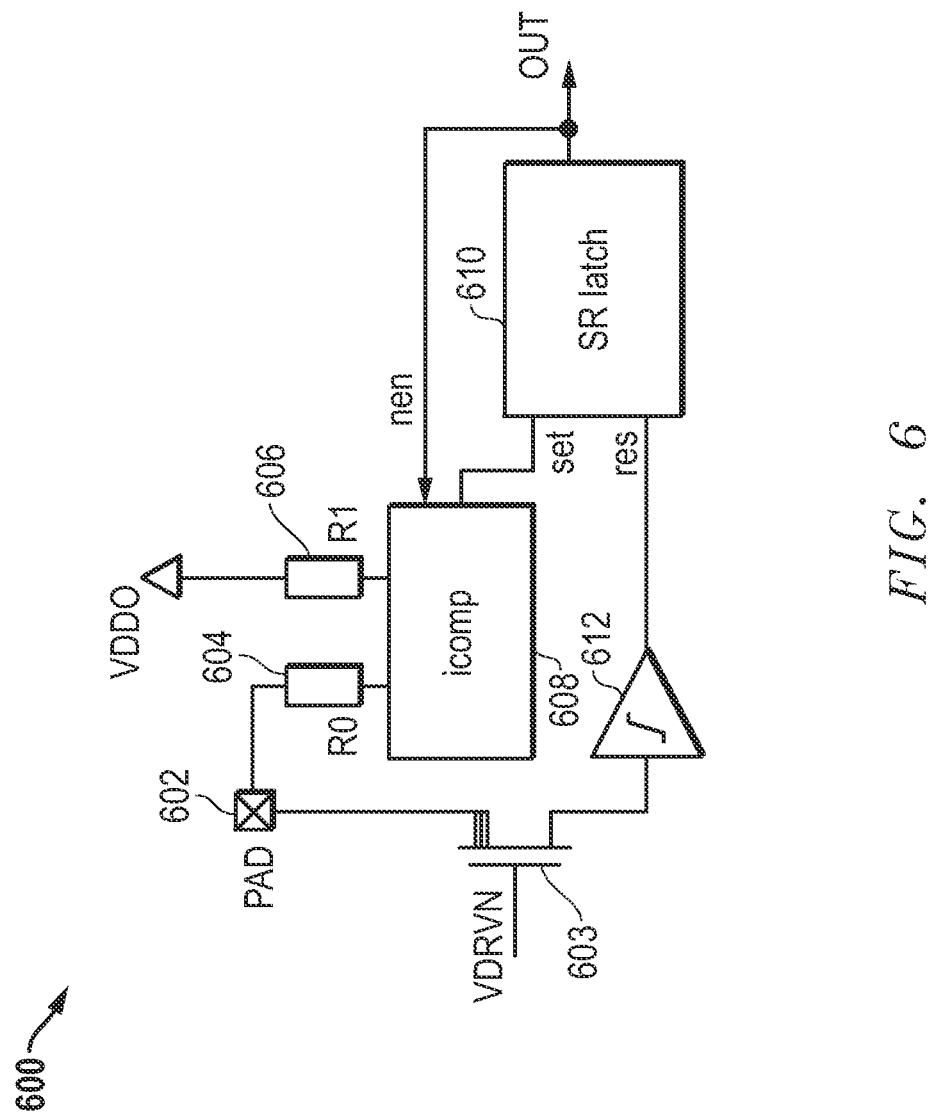
FIG. 6 illustrates in mixed block diagram and circuit diagram form a receiver circuit according to some embodiments.

FIG. 6 illustrates in mixed block diagram and circuit diagram form a receiver circuit 600 according to some embodiments. Receiver circuit 600 is suitable for use on an IO terminal in combination with a driver such as that of FIG. 1 for operating in an input mode to receive an incoming data signal, and works for high voltage IO signaling while consuming minimal current. Generally, receiver circuit 600 includes an NMOS transistor 603, a current comparator 608, a set-reset (SR) latch 610, and a Schmitt trigger 612.

NMOS transistor 603 is an LDMOS transistor having a gate receiving a drive voltage VDRVN, a drain coupled to an IO terminal 602 labelled "PAD", and a source. Schmitt trigger 612 has an input connected to the source of the NMOS transistor, and an output connected to the reset input of SR latch 610. Schmitt trigger 612 has a low voltage threshold input, preferably adjustable, for providing for a low threshold of the receiver. SR latch 610 has a set input, a reset input, and an output.

Current comparator 608 has a first input coupled to IO terminal 602 through a first resistor 604 having a value "R0", a second input coupled to a positive supply rail VDDO through a second resistor 606 having a value "R1", a disable input connected to the output of the SR latch 610 labeled "nen", and an output connected to the set input of the SR latch 610 for providing a high threshold of receiver circuit 600.

In operation, first resistor 604 creates a current with a value of the voltage on IO terminal 602 over R0. This current is mirrored and compared to the current through VDDO/R1 in current comparator 608. The high threshold "ViH" of receiver circuit 600 is based on a resistor ratio R0/R1, with ViH typically set at 70% of VDDO. Once VPAD reaches the 70% VDDO threshold, SR latch 610 toggles its output to HIGH and the current comparator 608 is disabled by the feedback connection.

Receiver circuit 600 also provides an adjustable low threshold "ViL" set in the Schmitt trigger 612, which is protected from the high signaling voltage at IO terminal 602 by NMOS transistor 603. A low state at IO terminal 602 causes Schmitt trigger 612 to trigger and resets SR latch 610, which also re-enables current comparator 608. If the IO terminal 602 voltage stay at 0V, the current comparator 608 does not consume any current (other than leakage current).

Thus, various embodiments of IO circuits, an integrated circuit including such IO circuits, and corresponding methods have been described. The driver circuits, associated logic, and receiver circuits described herein provide numerous advantages for IO signaling across a wide range of voltages and speeds, and are suitable for use with a variety of technology nodes.

The above-disclosed subject matter is to be considered illustrative, and not restrictive, and the appended claims are intended to cover all such modifications, enhancements, and other embodiments that fall within the true scope of the claims. For example, particular technology node employed may vary. As another example, the digital logic employed to control the driver circuit, receiver circuit, and charge pump circuitry herein may, of course, vary while providing the same functionality.

Thus, to the maximum extent allowed by law, the scope of the present invention is to be determined by the broadest permissible interpretation of the following claims and their equivalents, and shall not be restricted by the forgoing detailed description.

What is claimed is:

1. A driver circuit comprising:
an n-type metal-oxide semiconductor (NMOS) transistor having a source connected to a negative supply rail, a drain connected to an output terminal, and a gate;
a p-type metal-oxide semiconductor (PMOS) transistor having a source connected to a positive supply rail to receive a supply voltage, a drain connected to the output terminal, and a gate;
a first pre-driver supplied with a drive voltage and including an output connected to the gate of the NMOS transistor and an input receiving a data signal referenced to the drive voltage;
a second pre-driver including a positive supply input connected to the positive supply rail, a negative supply input receiving a second drive voltage equal to the supply voltage minus the drive voltage, an input, and an output connected to the gate of the PMOS transistor;
a level shifter circuit, supplied like the second pre-driver, for shifting the data signal to be referenced between the supply voltage and the second drive voltage, and including an output connected to the input of the second pre-driver; and
a charge pump circuit for providing the second drive voltage, the charge pump circuit driven with a variable switching frequency proportional to a current of the PMOS transistor.

2. The driver circuit of claim 1, further comprising:
a pulse train generator for driving the charge pump circuit with the variable switching frequency, the pulse train generator operable to vary a generated pulse train responsive to (a) a PMOS leakage current magnitude and (b) a transition of the data signal.

3. The driver circuit of claim 1, wherein:
the charge pump circuit comprises a two-phase on-chip capacitive charge pump.

4. The driver circuit of claim 1, wherein:
the driver circuit is operable with a supply voltage ranging at least from 0.9V to 5V; and
the drive voltage is between 1.5V and 1.9V.

5. The driver circuit of claim 2, wherein:
the second drive voltage is negative with respect to the negative supply rail when the supply voltage is less than the drive voltage.

6. The driver circuit of claim 1, wherein:
the PMOS and NMOS transistors are laterally-diffused metal-oxide semiconductor (LDMOS) transistors.

7. The driver circuit of claim 1, further comprising:
a receiver circuit coupled to the output terminal for operating in an input mode to receive an incoming data signal, the receiver circuit comprising:
a set-reset (SR) latch including a set input, a reset input, and an output;
an NMOS transistor having a gate receiving the drive voltage, a drain coupled to the output terminal, and a source;
a Schmitt trigger having an input connected to the source of the NMOS transistor, an output connected to the reset input of the SR latch, and an adjustable low voltage threshold input for providing for a low threshold of the receiver; and
a current comparator having a first input coupled to the output terminal through a first resistor, a second input coupled to the positive supply rail through a second resistor, a disable input connected to the output of the SR latch, and an output connected to the set input of the SR latch for providing a high threshold of the receiver.

8. A method of driving a data signal on a terminal comprising:
providing a supply voltage and a drive voltage;
creating a second drive voltage with a value of the supply voltage minus the drive voltage;
providing a data signal referenced to the drive voltage to a gate of an NMOS transistor coupled to the terminal to pull down the terminal;
level shifting the data signal to be referenced to the supply voltage and the second drive voltage;
providing the level-shifted data signal to a gate of a PMOS transistor coupled to the terminal to pull up the terminal; and
wherein creating the second drive voltage is performed with a charge pump circuit, the charge pump circuit driven with a variable switching frequency proportional to a current of the PMOS transistor.

9. The method of claim 8, wherein:
the charge pump circuit is driven with a plurality of pulses responsive to a transition from low to high of the data signal.

10. The method of claim 8, wherein:
the charge pump circuit comprises a two-phase on-chip capacitive charge pump.

11. The method of claim 8, further comprising:
based on a desired signaling voltage, altering the supply voltage within at least a range of 0.9V to 5V.

12. The method of claim 9, wherein:
the second drive voltage is negative with respect to a negative supply rail of the supply voltage when the supply voltage is less than the drive voltage.

13. The method of claim 8, wherein:

the PMOS and NMOS transistors are laterally-diffused metal-oxide semiconductor (LDMOS) transistors.

14. An integrated circuit comprising:

a driver circuit including:

a PMOS transistor coupled pull up an output terminal to a supply voltage when activated, and an NMOS transistor coupled to pull down the output terminal when activated;

a first pre-driver supplied with a drive voltage and including an output connected to a gate of the NMOS transistor and an input receiving a data signal referenced to the drive voltage;

a second pre-driver including a positive supply input receiving the supply voltage, a negative supply input receiving a second drive voltage equal to the supply voltage minus the drive voltage, an input, and an output connected to the gate of the PMOS transistor;

a level shifter circuit, supplied like the second pre-driver, for shifting the data signal to be referenced between the supply voltage and the second drive voltage, and including an output connected to the input of the second pre-driver; and a charge pump circuit for providing the second drive voltage, the charge pump circuit driven with a variable switching frequency proportional to a current of the PMOS transistor.

15. The integrated circuit of claim 14, wherein:

the charge pump circuit comprises a two-phase on-chip capacitive charge pump.

16. The integrated circuit of claim 14, wherein:

the charge pump circuit supplies level shifter circuits and second pre-drivers of multiple identical driver circuits.

17. The integrated circuit of claim 14, wherein:

the charge pump circuit is driven with a plurality of pulses responsive to a transition from low to high of the data signal.

18. The integrated circuit of claim 14, wherein:

the driver circuit is operable with a supply voltage ranging at least from 0.9V to 5V; and the drive voltage is between 1.5V and 1.9V.

19. The integrated circuit of claim 15, wherein:

the second drive voltage is negative with respect to a negative supply rail when the supply voltage is less than the drive voltage.

20. The integrated circuit of claim 14, wherein:

the PMOS and NMOS transistors are laterally-diffused metal-oxide semiconductor (LDMOS) transistors.

\* \* \* \* \*